United States Patent [19]

Koepf

[11] Patent Number: 5,138,436
[45] Date of Patent: Aug. 11, 1992

[54] INTERCONNECT PACKAGE HAVING MEANS FOR WAVEGUIDE TRANSMISSION OF RF SIGNALS

[75] Inventor: Gerhard A. Koepf, Boulder, Colo.

[73] Assignee: Ball Corporation, Muncie, Ind.

[21] Appl. No.: 614,936

[22] Filed: Nov. 16, 1990

[51] Int. Cl.[5] .................... H01L 23/12; H01L 23/14
[52] U.S. Cl. ........................................ 357/74; 357/75; 357/80
[58] Field of Search ............ 357/80, 74, 75, 81; 174/52.4; 361/401, 386, 321, 398, 399, 400, 392, 393, 394, 397, 413, 414

[56] References Cited

U.S. PATENT DOCUMENTS

| | | | |
|---|---|---|---|
| 4,338,621 | 7/1982 | Braun | 357/80 |
| 4,539,622 | 9/1985 | Akasaki | 361/401 |
| 4,654,694 | 3/1987 | Val | 357/74 |
| 4,744,008 | 5/1988 | Black et al. | 361/401 |
| 4,751,482 | 6/1988 | Fukuta et al. | 361/399 |
| 4,755,910 | 7/1988 | Val | 361/401 |
| 4,878,070 | 10/1989 | Watrobski | 361/412 |
| 4,903,120 | 2/1990 | Beene et al. | 357/74 |
| 4,982,311 | 1/1991 | Dehaine et al. | 357/74 |

Primary Examiner—Andrew J. James
Assistant Examiner—S. V. Clark
Attorney, Agent, or Firm—Gilbert E. Alberding

[57] ABSTRACT

An interconnection package is provided for a circuitry component, such as an integrated circuit, comprising a support member for supporting the circuitry component and an interconnect member placed over the circuitry component. The interconnect member has interconnect transmission lines on at least one surface for transmitting currents and signals to and from the circuitry component. When the package is to contain a monolithic microwave integrated circuit (MMIC), millimeter waveguides are employed to transmit RF signals to and from the MMIC through the package. The MMIC is positioned in cavities in the support member and the interconnect member is placed over the MMIC. RF interconnect transmission lines on the interconnect member can be connected directly to RF contact pads on the MMIC or can be electromagnetically coupled. DC interconnect transmission lines are connected directly to DC contact pads on the integrated circuit. Use of the support member and the interconnect member provides a total of three levels on which to dispose interconnect transmission networks, including crossovers, and peripheral circuit components.

46 Claims, 6 Drawing Sheets

INTERCONNECT PACKAGE HAVING MEANS FOR WAVEGUIDE TRANSMISSION OF RF SIGNALS

TECHNICAL FIELD OF THE INVENTION

This invention relates in general to the packaging of circuitry components, and in particular to making interconnections with contact pads of circuitry components such as integrated circuit chips.

BACKGROUND OF THE INVENTION

Integrated circuit chips and other circuitry components can be coupled to each other and to other circuits in compact modules, units and packages. For example, several monolithic microwave integrated circuits (MMIC's) in chip form can be packaged to provide a unit capable of operating at microwave and millimeter wave frequencies. Advancements in GaAs MMIC's, and in particular, those which operate in the millimeter bands, have made it especially critical that connections with such chips, particularly RF connections, be of the highest quality. That is, interconnections must be made consistently such that they provide good impedance match between the MMIC and the means of transmission, and the connections themselves must be reliable.

Each MMIC chip may contain several microwave or millimeter wave circuits such as amplifier, converter or oscillator circuits depending on the function and level of integration. For interfacing both DC and RF signals and currents a MMIC chip has contact pads on one surface, typically around the perimeter of the top surface, which are connected by internal conducting lines to various portions of the actual circuits within the chip. In the case of RF connections between circuits within a chip, either microstrip or coplanar waveguides are used to form waveguide transmission lines. Chips that use internal microstrip transmission lines typically have a conducting ground plane on the bottom surface of the chip in opposing relation to the transmission lines.

Existing MMIC packages typically utilize a chip carrier, sometimes called a motherboard, designed to support one or more MMIC's. The chip carrier has a conducting ground plane on one surface and thin film metallization patterns disposed on the opposing surface providing DC and RF interconnections among the MMIC's and between the MMIC's and package input-/output terminals. The RF interconnects serve as waveguide transmission lines employing such techniques as microstrip or coplanar fabrication.

In such existing MMIC packages, MMIC chips are mounted on the chip carrier, typically in recesses in the carrier surface, and interconnections between contact pads on the chip surface and interconnect metallizations on the chip carrier are made by bonding wires or ribbons. In some existing MMIC packages, longer interconnects are made by miniature coaxial cable. In another packaging method, known as waffle line, the chip carrier is made of metal having a waffle shaped surface (two-dimensional grooves cut into metal). This metal surface acts as a ground plane; flat areas are created in locations where chips and other circuit components are to be mounted. DC and RF interconnections are made by bonding insulated wire to chip contact pads. The wires carrying RF signals are pressed into and routed through the waffle line grooves to provide shielding similar to the outer conductor of a coaxial cable.

Packages for chips operating at lower frequencies or DC (digital chips, for example) can utilize interconnect methods similar to those employed with MMIC chips but may not require the chip carrier to have a ground plane surface when waveguide transmission is not employed.

In all of the existing interconnection methods discussed, wire, ribbon or cable must be bonded to chip contact pads, a process in which each connection must be made either directly by hand or indirectly by an operator guiding a bonding machine. As can be appreciated, manually making such interconnections is labor intensive and time consuming resulting in higher production costs. Furthermore, because of the extremely small dimensions involved, repeatability of reliable interconnections is difficult to achieve leading to inconsistent and less than optimum impedance matched interconnects and thus to performance variations between otherwise identical packages. An additional disadvantage of existing packaging techniques is that the chip carrier only provides one level (the carrier surface) for DC and RF interconnection networks and for mounting peripheral circuit components such as chip capacitors. If crossovers of DC and/or RF interconnections are required, then extra wire bonding must be used.

Consequently, a need has arisen for more consistent and less labor intensive packaging techniques for circuitry components to increase repeatability, to provide more than one circuit level for interconnections and placement of peripheral components, and to decrease the production cost of functional modules

SUMMARY OF THE INVENTION

In accordance with the present invention, a packaging technique for circuitry components, including integrated circuit chips, is provided which increases the repeatability of reliable interconnections, decreases the production costs, and provides more than one level for interconnections and peripheral circuit components. All connections to and from a circuitry component are made simultaneously in a single processing step rather than relying on individually hand soldered DC and RF connections.

In particular, the present invention provides a novel package for at least one circuitry component which has one or more interconnect contact pad(s) on a top surface. The package enables the circuitry component to be interconnected with other circuitry components and with circuits external to the package. The package includes a support member for supporting the circuitry component and an interconnect member positioned above the circuitry component. The support member can include a carrier having a recess for the circuitry component. The interconnect member has interconnect transmission lines on at least one surface for the transmission of currents (including signals) to and from the circuitry component along with means for coupling the contact pads to the interconnect transmission lines. In the case of an RF circuitry component, such as a monolithic microwave integrated circuit (MMIC), RF coupling between the MMIC and interconnect transmission lines can be made by direct electrical contact or can be made indirectly with electromagnetic coupling. Low frequency and DC circuitry components are coupled with direct electrical connections.

The package of the present invention permits interconnect transmission lines to be printed on either or both surfaces of the interconnect member and, as mentioned above, opposing contact pads can be coupled in a variety of ways. For example, when DC interconnect transmission lines are printed on the bottom surface of the interconnect member (i.e., the surface facing the chip), coupling can be accomplished with solder bumps between the contact pads (whether on the chip or on the support member). When DC interconnect transmission lines are printed on the top surface of the interconnect member (i.e., the surface facing away from the chip), coupling can be accomplished with metallized vias throughout the interconnect member connected at the upper end to the interconnect transmission lines and at the lower end to solder bumps which, in turn, provide contact with the contact pads on the chip or the support member.

Similarly, when RF interconnect transmission lines are printed on the bottom surface of the interconnect member, coupling can be accomplished with solder bumps between the contact pads. In addition, whether RF interconnect transmission lines are printed on the bottom surface of the interconnect member or the top, coupling can be accomplished electromagnetically.

To make the interconnections, the circuitry components are positioned with the interconnect member and simultaneously bonded thereto. The interconnect member, with the circuitry components attached, is then placed over the support member and soldered in place.

In one embodiment of the present invention, adapted particularly for MMIC chips, the interconnect member is a dielectric interconnect substrate positioned on top of the MMIC chips. The interconnect substrate has DC and RF interconnect transmission lines printed on one or both surfaces, the RF interconnect lines being dimensioned in combination with a package ground plane on the support member and a dielectric positioned in between to provide waveguides (such as microstrip or coplanar waveguides) of the proper impedance for satisfactory circuit performance.

In one variation of the foregoing embodiment, the support structure has a chip carrier for the MMIC's. It has a dielectric top surface and a package ground plane underneath. MMIC chips are placed in one common recess or in separate recesses in the chip carrier parallel to the package ground plane such that chip ground planes on the MMIC's are in substantial planar contact with the package ground plane. Conductive interconnect lines for both DC and RF can be printed on the top surface of the chip carrier with the RF interconnect lines dimensioned to form microstrip waveguides in conjunction with the package ground plane and a dielectric material in between. Each transmission line in the MMIC, on the chip carrier and on the interconnect substrate terminates in a contact pad or terminal. By matching patterns of contact pads on the interconnect substrate to patterns of contact pads on the chips, by matching patterns of contact pads on the chip carrier to patterns of contact pads on the interconnect substrate, and by providing coupling between opposing contact pads, all RF and DC bias paths inside the chip package can be completed.

Consequently, the package of the present invention provides the technical advantage that all DC and RF interconnections to and from circuitry components can be made in a single processing step. Similarly, all interconnections between the interconnect member and the support member can also be made in a single processing step. A further advantage of the present invention is that the interconnect member provides two additional levels for interconnect networks and for mounting peripheral circuit elements. This enables RF and DC interconnect lines to be patterned on different levels thereby allowing cross-overs. Also, passive circuit elements such as capacitors, inductors or filter structures can be printed as thin film metallizations directly on any of the available surfaces.

BRIEF DESCRIPTIONS OF THE DRAWINGS

For a more complete understanding of the present invention, and the advantages thereof, reference is now made to the following descriptions taken in conjunction with the accompanying drawings, in which.

DETAILED DESCRIPTION

The present invention is best understood by referring to FIGS. 1-6 of the drawings, like numerals being used for like and corresponding parts of the various drawings.

The present invention provides a package for a circuitry component which has interconnect contact pads on a top surface and allows the circuitry component to be interconnected with other circuitry components and with circuits external to the package. The package includes a support member for supporting the circuitry component and an interconnect member positioned above the circuitry component. The support member can include a carrier having a recess for the circuitry component. The interconnect member has interconnect transmission lines on at least one surface for the transmission of currents (including signals) to and from the circuitry component along with means for coupling the contact pads to the interconnect transmission lines. In the case of an RF circuitry component, such as a monolithic microwave integrated circuit (MMIC), the RF coupling between the MMIC and interconnect transmission lines can be made by direct electrical contact or can be made indirectly with electromagnetic coupling. Low frequency and DC circuitry components are coupled with direct electrical connections.

Although the following described embodiments are particularly adapted for monolithic microwave integrated circuit (MMIC) chips, it should be understood that other embodiments, which provide interconnects for other types of circuitry components, are within the scope of the present invention.

Figure 1:
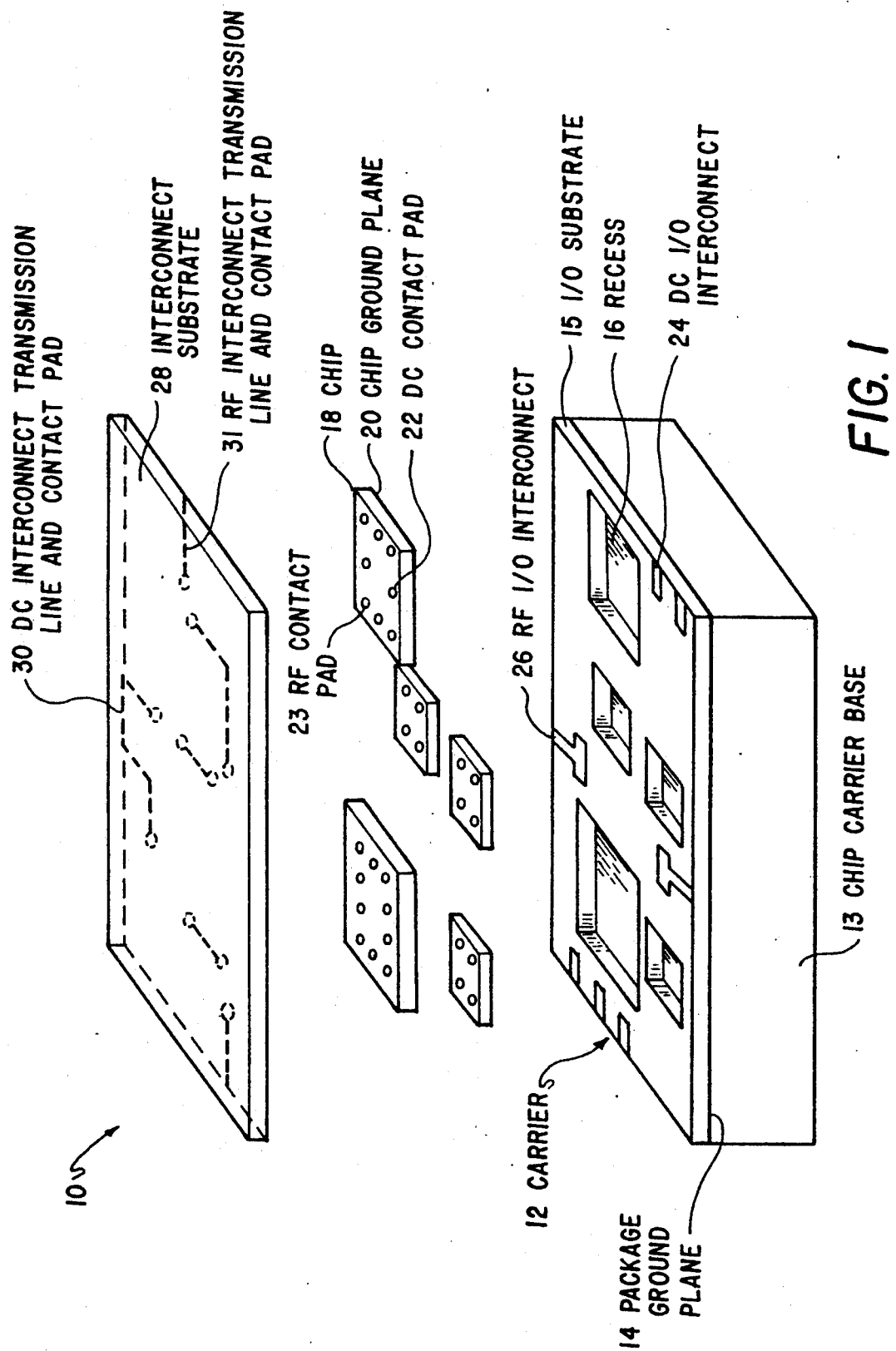
FIG. 1 illustrates one embodiment of the interconnect package of the present invention.

FIG. 1 illustrates one embodiment of an interconnect package, generally indicated as 10, for MMIC chips and other circuitry components having contact pads on one surface. A support member, or chip carrier, 12 has a lower portion or base 13, an upper portion or input/output (I/O) substrate 15 and a ground means, such as a package ground plane 14, disposed between upper and lower portions 13 and 15. I/O substrate 15 has recesses 16 formed therethrough to expose package ground plane 14. MMIC's, such as that indicated by 18, have a chip ground plane 20 on one surface (the lower surface in the orientation illustrated) and are retained within recesses 16 such that each chip ground plane 20 is in substantial planar contact with package ground plane 14 across the surface of chip ground plane 20. (As will be appreciated, such terms as "upper", "lower", "above" and "below" are used solely to facilitate reference to the Figures and are not intended to limit the present invention to any particular orientation.)

MMIC 18 has contact pads 22 and 23 on the surface opposite chip ground plane 20 (the upper surface) which are coupled to various elements of the circuits contained within MMIC 18. Some contact pads 22 provide connections for DC currents and signals while others 23 provide connections for RF signals. RF contact pads 23 are coupled to waveguide transmission lines within MMIC 18 which, with chip ground plane 20 and a dielectric in between (not shown), define microstrip line waveguides for transmission of the RF signals inside MMIC 18.

Similarly, various input/output interconnects and terminals (hereinafter collectively referred to as "I/O interconnects") 24 and 26 for DC and RF, respectively, are disposed on the top surface of input/output substrate 15. Together with package ground plane 14, these I/O interconnects 24 and 26 provide means by which MMIC 18 within package 10 can be coupled to other circuits, power supplies and the like external to package 10.

In contrast to existing chip interconnect packages, in which connections to chip contact pads are made manually by wire or ribbon bonding, the interconnect package 10 of the present invention provides a system by which interconnections are made via an interconnect member placed on top of the support member. In the embodiment illustrated in Figure the interconnect member is a dielectric interconnect substrate 28 placed on top of chip carrier 12. Similar to the disposition of I/O interconnects 24 and 26 on I/O substrate 15, DC and RF interconnect transmission lines 30 and 31 are disposed on interconnect substrate 28. These interconnect transmission lines terminate at each end in contact pads. There are two kinds of contact pads, a first set of contact pads that are matched with opposing I/O terminals 24 and 26 on I/O substrate 15 of chip carrier 12, and a second set of contact pads which are matched with opposing contact pads 22 and 23 on the top surface of chip 18. To provide satisfactory impedance matching, the first and second sets of contact pads may have different shapes or sizes.

I/O interconnects 24 and 26 on chip carrier 12 and interconnect transmission lines and contact pads (hereinafter collectively referred to as "interconnect transmission lines") 30 and 31 on interconnect substrate 28 are preferably patterned on their respective substrates using conventional thin-film photo-lithographic/etching techniques although other techniques can also be used.

In the preferred embodiment, interconnect transmission lines 30 and 31 are disposed on the bottom surface of interconnect substrate 28, which faces the top surface of chip carrier 12 and MMIC chip 18. Electrical connections between opposing RF and DC contact pads can be made by solder bumps (not shown in FIG. 1). Coupling between opposing RF contact pads can also be made electromagnetically, as will be detailed below.

In another embodiment, interconnect transmission lines 30 and 31 are disposed on the top surface of interconnect substrate 28, facing away from chip carrier 12 and MMIC chip 18 (the top surface of interconnect substrate 28), and in a yet other embodiment, interconnect transmission lines 30 and 31 are disposed on both surfaces of interconnect substrate 28. When top surface interconnect transmission lines are used for making DC connections, metallized via holes are provided through interconnect substrate 28 to contact pads on the bottom surface of interconnect substrate 28.

In operation, low frequency and DC currents and signals are connected to DC I/O interconnects 24 of I/O substrate 15 and flow through sections of DC I/O interconnects 24 to connections with DC interconnect transmission lines 30 on interconnect substrate 28, through DC interconnect transmission lines 30 to connections with DC contact pads 22 on MMIC 18. Low frequency and DC currents and signals are similarly conveyed between different chips.

RF signals coupled to the I/O RF interconnects 26 are guided by waveguides on chip carrier 12 to RF interconnect transmission lines 31, then by waveguides on interconnect substrate 28 to RF contact pads 23 on MMIC chip 18. RF signals are also guided between different chips by coupling the RF contact pads on one chip to RF interconnect transmission lines 31 on substrate 28 and back to the RF contact pads on other chips.

Preferably, RF interconnect transmission lines 31 disposed on substrate 28 are kept short so as to direct RF signals to RF I/O interconnects 26 on chip carrier 12 for most of the signal path. On the other hand, DC interconnect transmission lines 30 disposed on interconnect substrate 28 can be freely routed. This permits separation of RF and DC interconnect lines on different surfaces of interconnect substrate 28, providing more freedom in the design of interconnect networks and crossovers. Similarly, separation of DC and RF interconnect networks is possible by using both surfaces of interconnect substrate 28 and the top surface of I/O substrate 15.

For satisfactory transmission of RF signals, it is desirable that the space or gap between chip carrier 12 and interconnect substrate 28 be substantially uniform. To provide a substantially uniform gap 25 over chip carrier 12 and recessed MMIC chip 18, I/O substrate 15 is of substantially the same thickness as the MMIC chips. Gap 25 should be small enough to provide efficient coupling either through solder bumps or through electromagnetic coupling, but not so small that the dielectric material of interconnect substrate 28 adversely affects the performance of the MMIC's. To help reduce the effect of interconnect substrate 28 on the performance of the MMIC's, the material in interconnect substrate 28 can be thinned or entirely cut out just above MMIC chip 18.

The uniformity of the width of the gap can be controlled in various ways, the preferred method being hard stops or spacers positioned between interconnect substrate 28 and chip carrier 12 in places where such spacers will not interfere with the function of the circuit.

Figure 2:
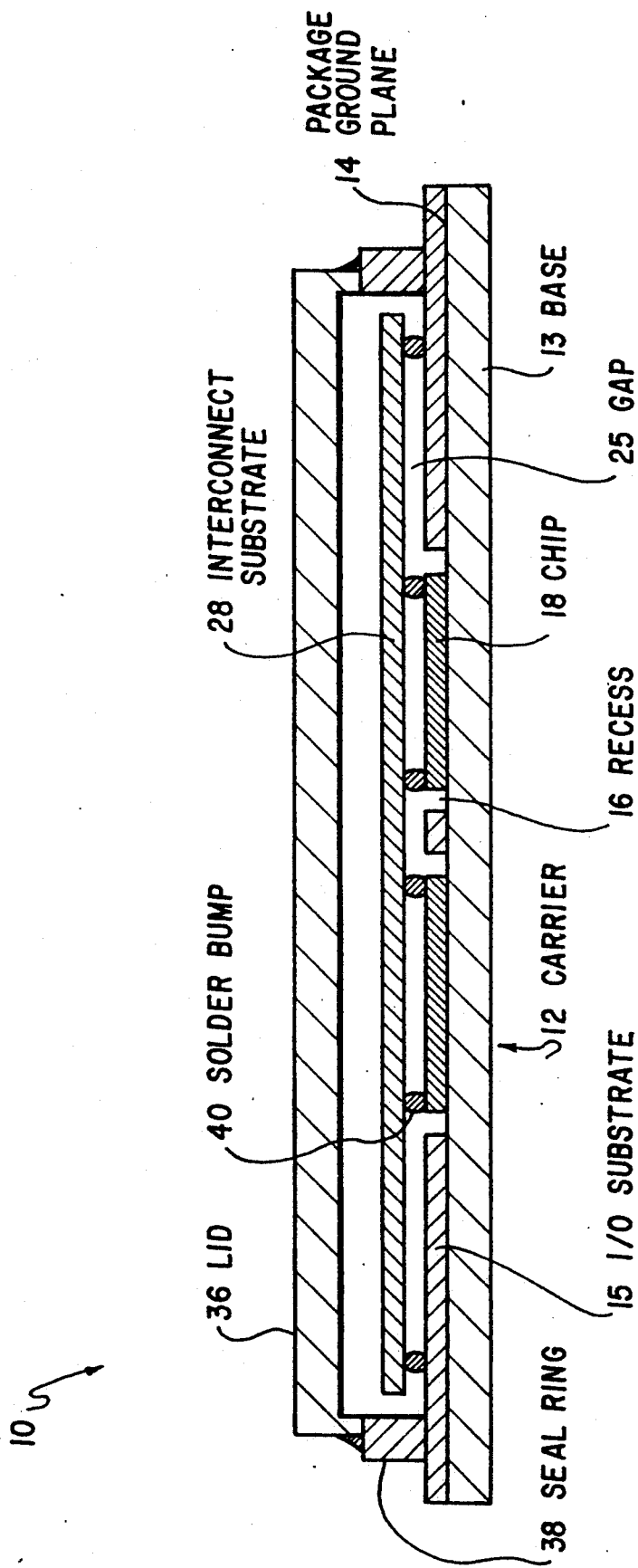
FIG. 2 illustrates a cross-sectional view of the embodiment of the interconnect package illustrated in FIG. 1.

FIG. 2 illustrates a cross sectional view of the embodiment of interconnect package 10 shown in FIG. 1.

MMIC 18 is retained in recess 16 of chip carrier 12 which includes base 13, I/O substrate 15 and package ground plane 14. Also shown is a lid 36 which, with a seal ring 38, completely encloses and seals MMIC 18 and dielectric interconnect substrate 28. DC and RF chip contact pads 22 and 23, DC and RF interconnect transmission lines 30 and 31, and DC and RF I/O interconnects 24 and 26 are also present in the embodiment of FIG. 2 but are not illustrated. Between opposing DC and RF contact pads, solder bumps 40 are shown.

Figure 3:
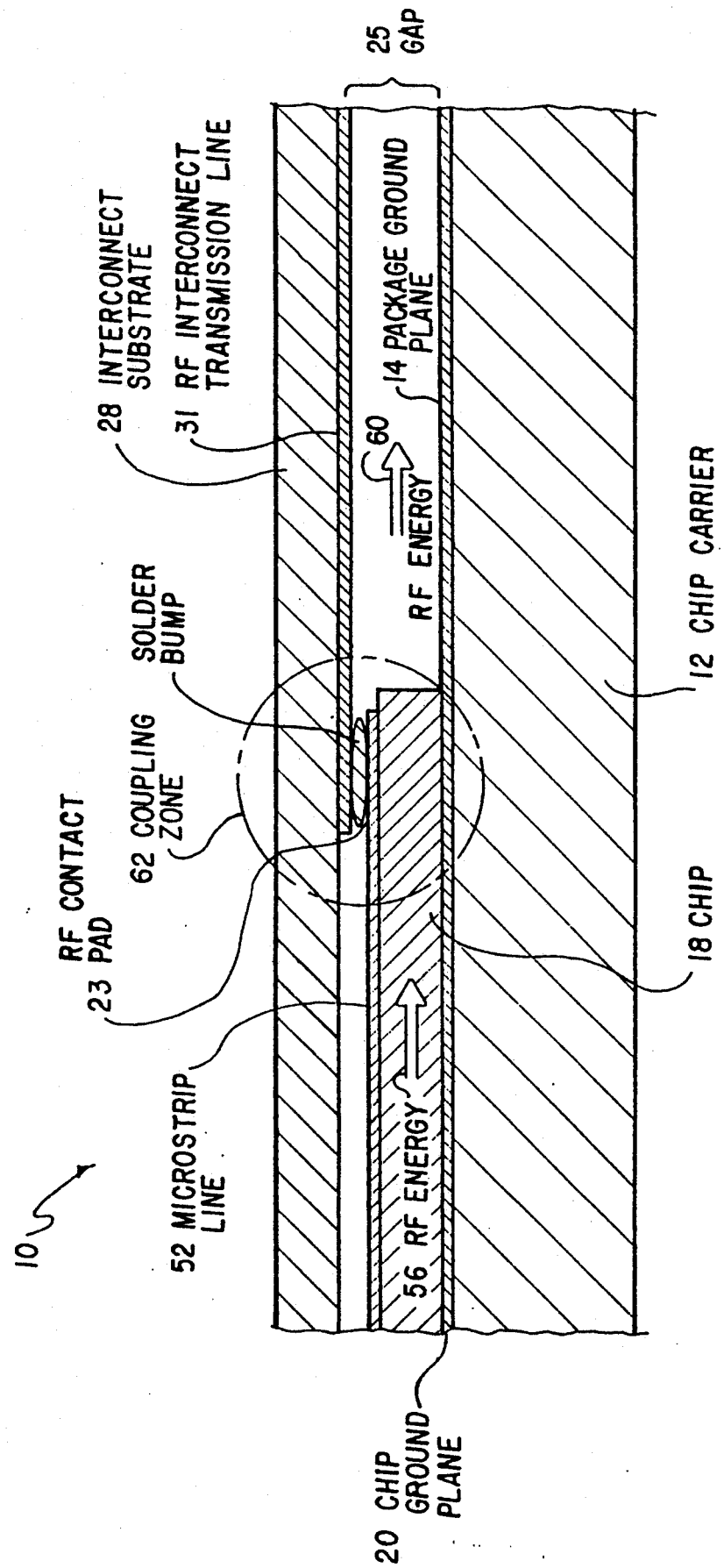
FIG. 3 illustrates a schematic cross-sectional view of one embodiment of the present invention in which opposing DC and RF contact pads are directly connected through the use of solder bumps.

A more detailed illustration of an RF transition from MMIC chip 18 to interconnect substrate 28 using solder bumps is shown in FIG. 3. In operation, RF energy 56 propagates in a waveguide in MMIC 18, comprising package ground plane 14, microstrip transmission line 52 on the top surface of chip 18 and an intermediate dielectric material. Upon reaching the end of metallization 52, or an RF contact pad, RF energy 56 is guided through solder bump 40 to RF interconnect transmission line 31 on the underside of interconnect substrate 28. RF interconnect transmission line 31, in conjunction with package ground plane 14 and the intermediate dielectric layer, forms another microstrip waveguide for continued propagation of RF energy 60 through package 10. It can then be coupled to other MMIC's or to an RF I/O interconnect 26. DC currents are conducted without waveguides from DC contact pads 22 on chip 18 through solder bump 40 to DC interconnect transmission lines 30 on substrate 28 and to DC I/O interconnects 24.

Figure 4:
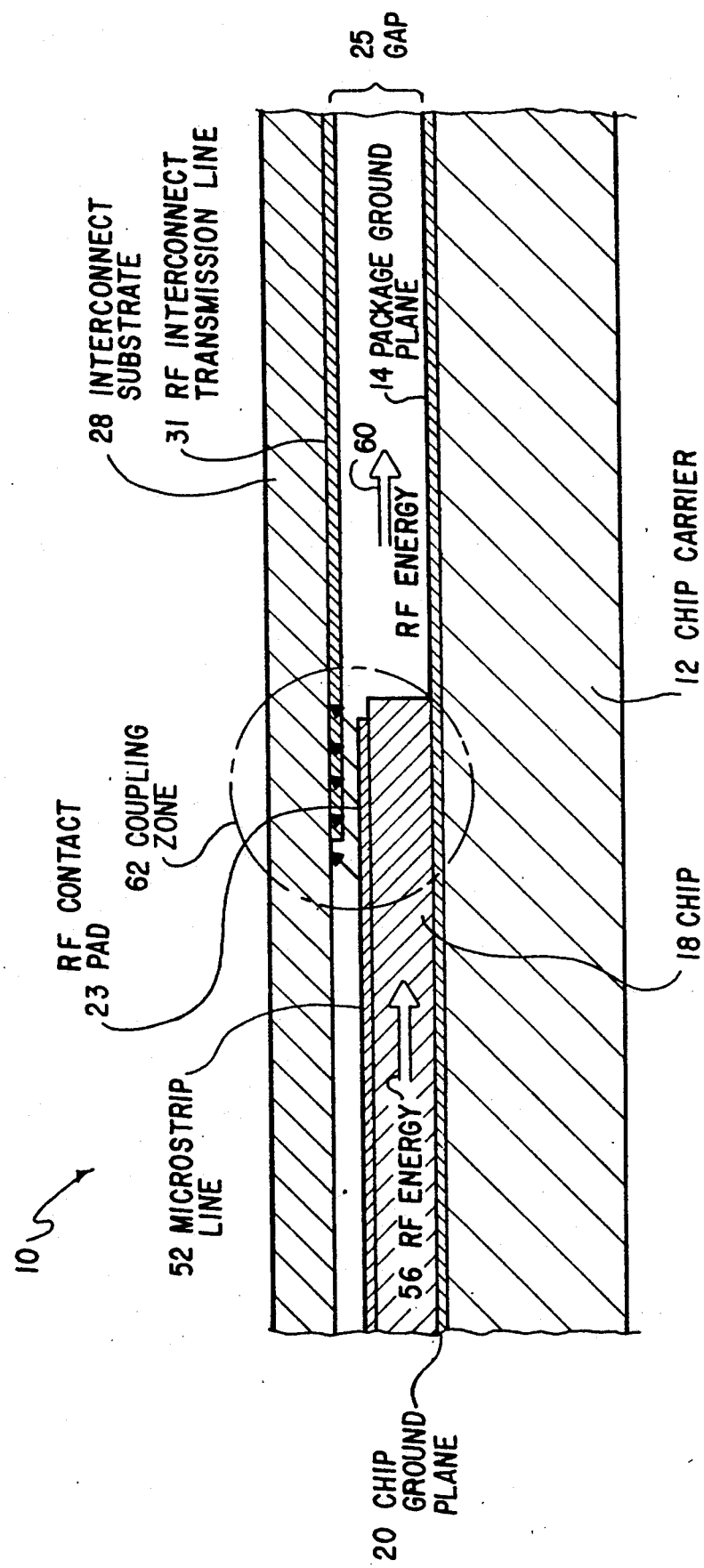
FIG. 4 illustrates a schematic cross-sectional view of an alternative embodiment of the present invention in which opposing RF contact pads are electromagnetically coupled.

Another embodiment uses solder bumps only for connecting opposing DC contact pads and utilizes electromagnetic coupling between opposing RF contact pads. As illustrated in FIG. 4, RF energy 56 propagates along a waveguide in chip 18, comprising microstrip line 52, package ground plane 14 and an intermediate dielectric material, to a coupling zone 62. There, RF chip contact pad 23 is patterned for electromagnetic, i.e., contactless, coupling of RF energy to another waveguide, again comprised of RF interconnect transmission line 31, package ground plane 14, and a dielectric in between.

In the embodiment of the electromagnetic coupling illustrated in FIG. 4, RF interconnect transmission line 31 is patterned on the bottom surface of dielectric interconnect substrate 28, which faces MMIC 18. In this embodiment, an air gap 25 between RF interconnect transmission line 31 and package ground plane 14 serves as the dielectric medium through which the RF energy is propagated within package 10. In an alternative embodiment, RF interconnect transmission line 31 is patterned on the top surface of dielectric interconnect substrate 28, facing away from MMIC 18. In this latter embodiment, dielectric interconnect substrate 28 is, itself, part of the dielectric layer within the waveguide bounded by RF interconnect transmission line 31 and package ground plane 14 and through which the RF energy propagates.

Other arrangements of DC and RF transmission interconnect lines 30 and 31 are possible within the scope of this invention. For example, RF interconnect transmission lines 31 can be printed on the bottom surface of dielectric interconnect substrate 28 and be coupled to RF contact pads 23 and to RF I/O interconnects 26 with solder bumps in the manner previously described. DC interconnect transmission lines 30 can be printed on the top surface of dielectric interconnect substrate 28 and be connected to DC pads 22 and to DC I/O interconnects 22 with metallized vias through interconnect substrate 28 to solder bumps between interconnect substrate 28 and chip 18. In another embodiment, RF interconnect transmission lines 31 can be printed on the top surface of dielectric interconnect substrate 28 and be electromagnetically coupled to RF contact pads 23 and to RF I/O interconnects 26 while DC interconnect transmission lines 30 can be printed on the bottom surface and be coupled to DC contact pads 22 and to DC I/O interconnects 22 with solder bumps. In still another embodiment, an interconnect network may require that some of RF interconnect transmission lines 31 be printed on one surface of dielectric interconnect substrate 28 and some be printed on the other surface. Similarly, some of DC interconnect transmission lines 30 can be printed on one surface of dielectric interconnect substrate 28 and some be printed on the other surface. These and other alternative embodiments retain the technical advantages of allowing all interconnections to be made securely and reliably in a single step, allowing millimeter wave transmission of RF signals to and from MMIC 18, and providing more than one interconnect level.

Furthermore, the use of dielectric interconnect substrate 28 provides two additional surfaces on which to mount discrete circuit elements or to print thin-film circuit elements. Thus, a complete package can include interconnect lines and circuit elements on one or more of the following three surfaces: the top surface of I/O substrate 15 which faces interconnect substrate 28; the bottom surface of interconnect substrate 28 which faces carrier 12; and the top surface of interconnect substrate 28 which faces away from carrier 12.

Figure 5:
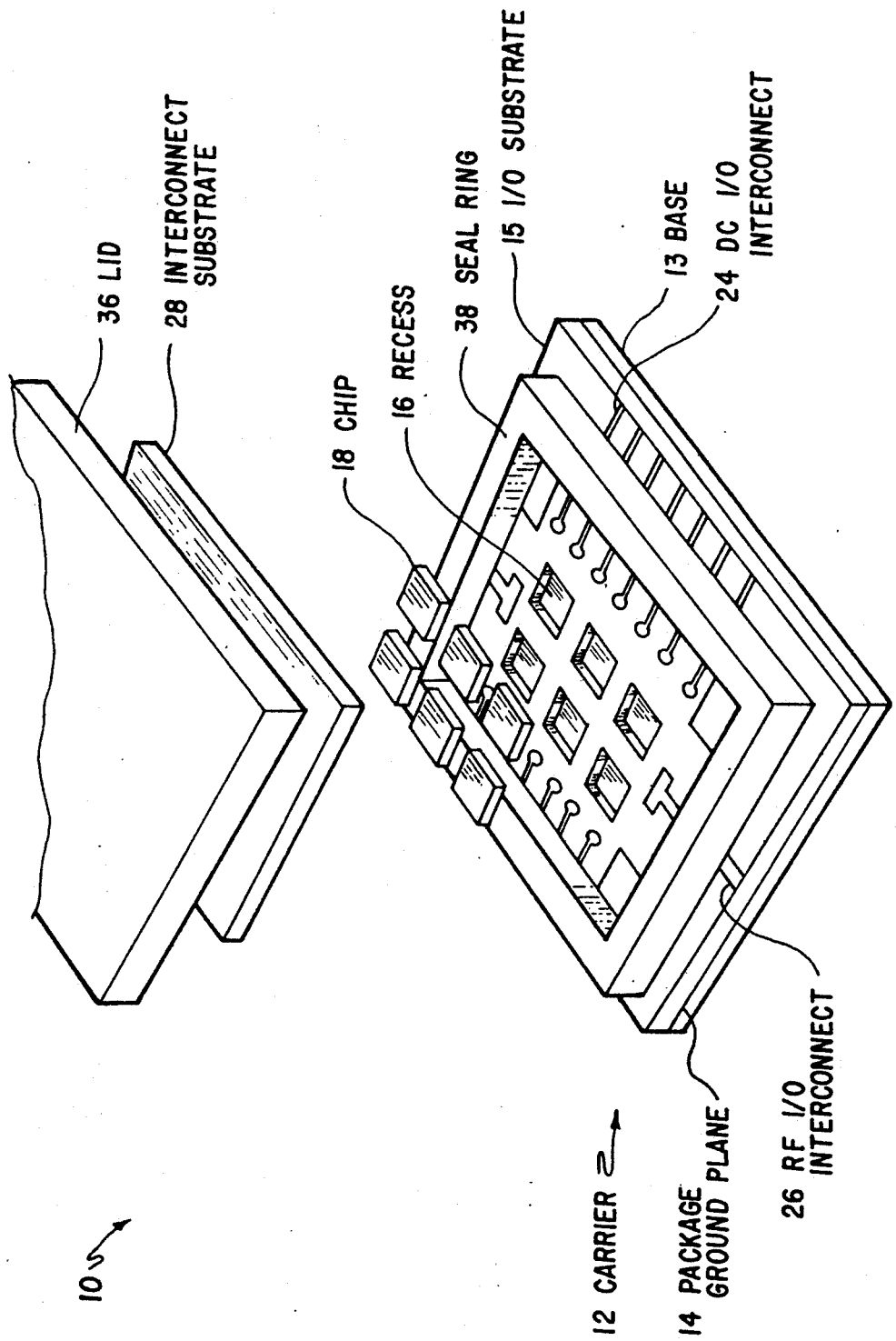
FIG. 5 illustrates an exploded view of one embodiment of the present invention.

FIG. 5 illustrates an exploded view of the details of one embodiment of the present invention. As in FIG. 1, MMIC's, such as MMIC 18, are retained within recesses 16 of chip carrier 12. The chip ground planes (not shown) are in substantial planar contact with package ground plane 14. Dielectric interconnect substrate 28, having interconnect transmission lines (not shown), is positioned over the MMIC's and carrier 12. Carrier 12 also has package DC and RF I/O interconnects 24 and 26 to provide connections with other such interconnect packages, other circuits or external devices.

Carrier 12 comprises upper portion, or I/O substrate, 15 and lower portion, or base 13. Seal ring 38 is positioned around carrier 12 to surround dielectric interconnect substrate 28. Lid 36 is placed on top of seal ring 38. The surface of lid 38 which faces dielectric interconnect substrate 28 can be plated with a resistive film to dampen cavity modes of the package. Base 13 may be made of a metal or a dielectric providing strength and good thermal conductivity to conduct heat out of the package. I/O substrate 15, interconnect substrate 28, seal ring 38, and lid 36 can be made of dielectric materials which have coefficients of thermal expansion which closely match the coefficient of thermal expansion of the integrated circuit chips retained within carrier 12. When the chips are, for example, GaAs MMIC's, base 13 can be a material such as molybdenum, copper-tungsten, beryllium oxide or silicon; I/O substrate 15 can be a material such as alumina (ceramic); interconnect substrate 28 can be a material such as alumina or certain glasses: and seal ring 38 and lid 36 can be a material such as ceramic. It will be appreciated that other materials can also be used.

Referring still to FIG. 5, an assembly process of the preferred embodiment of the present invention will be described. The assembly commences with preparation of chip carrier 12, MMIC chips, interconnect substrate 28, seal ring 38 and lid 36. Chip carrier 12 is assembled by soldering I/O substrate 15 with package ground plane 14 to base 13. Interconnect networks are patterned on I/O substrate 15 and interconnect substrate 28. Seal ring 38 is secured to chip carrier 12. Solder bumps are plated up on interconnect transmission lines on interconnect substrate 28 using two solder hierarchies, one that melts at a higher temperature for the second set of contact pads (to connect interconnect transmission lines with MMIC contact pads) and one that melts at a lower temperature for the first set of contact pads (to connect interconnect transmission lines with I/O interconnects on carrier 12). MMIC chips are aligned one at a time with interconnect substrate 28 in their respective positions and, using the higher temperature solder hierarchy, are reflow soldered to interconnect substrate 28. Once all MMIC chips are attached, interconnect substrate 28 is itself aligned with chip carrier 12 and soldered in place using the lower temperature solder bumps. In the same process chip ground planes are soldered to package ground plane 14 inside recesses 16 in chip carrier 12. Finally, lid 36 is hermetically sealed on top of seal ring 38 using an even lower temperature solder hierarchy. Other processes are available to provide hands-off and cost effective assembly of the package of the present invention.

Figure 6:
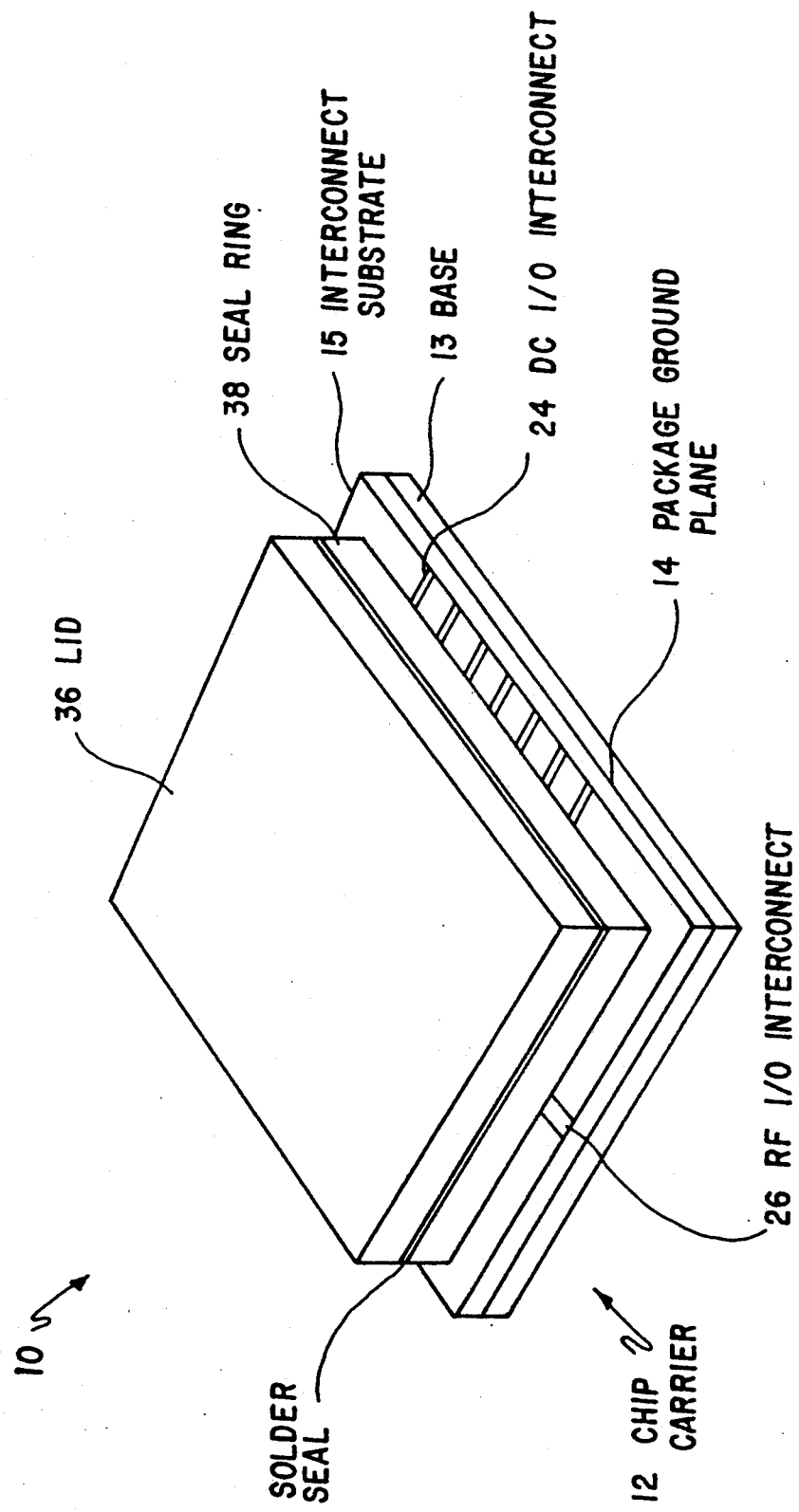
FIG. 6 illustrates the interconnect package of FIG. 5 with all of the components sealed into place.

FIG. 6 illustrates the package of FIG. 5 with all of the components sealed in place.

Although the present invention has been described in detail, it should be understood that various changes, substitutions and alterations can be made herein without deporting from the spirit and scope of the invention as defined by the appended claims. For example, in another embodiment, the chip carrier of the present invention can be adapted for other types of circuitry components and integrated circuits and if waveguide transmission is not required, the package ground means can be omitted.

What is claimed is:

1. An interconnect package for an integrated circuit chip having at least one chip contact pad on a first surface, comprising:
    a support member for supporting the chip;
    an interconnect member disposed in opposing relation to the first surface of the chip for transmission of at least one of electrical currents or signals to and from the chip; and
    means for waveguide transmission of signals to and from the chip, including:
        an interconnect transmission line disposed on a surface of said interconnect member and electrically coupled to one of the at least one chip contact pad;
        a package ground means on said support member wherein a chip ground plane on a second surface of the chip is substantially parallel to said package ground means and electrically coupled thereto; and
        dielectric means disposed between said interconnect transmission line and said package ground plane.

2. The interconnect package of claim 1 wherein said interconnect transmission line is electromagnetically coupled to the chip contact pad.

3. The interconnect package of claim 1 wherein said interconnect transmission line faces the first surface of the chip and said means for waveguide transmission further includes a solder bump disposed between the chip contact pad and said interconnect transmission line.

4. The interconnect package of claim 1 wherein said interconnect transmission line faces away from the first surface of the chip and said means for waveguide transmission further includes:
    a metallized via formed through said interconnect member, said via being in electrical contract with said interconnect transmission line; and
    a solder bump disposed between the chip contact pad and said via.

5. An interconnect package for a monolithic microwave integrated circuit chip having an RF contact pad on a first surface, the interconnect package including:
    a support member for supporting the chip;
    an interconnect member disposed in opposing relation to the first surface of the chip for transmission of at least one of electrical currents or signals to and from the chip;
    a package ground means on said support member wherein a chip ground plane on a second surface of the chip is in substantial planar contact with said package ground means;
    an RF interconnect transmission line disposed on a surface of said interconnect member, said RF interconnect transmission line having a first end;
    dielectric layer disposed between said RF interconnect transmission line and said package ground means; and
    RF coupling means for coupling the RF contact pad with said first end of said RF interconnect transmission line;
    wherein said RF interconnect transmission line, said package ground means and said dielectric layer form a waveguide for transmission of RF signals to and from the chip.

6. The interconnect package of claim 5 wherein said RF coupling means includes:
    said RF interconnect transmission line being disposed on the surface of said interconnect member facing the first surface of the chip; and
    a solder bump disposed between the RF contact pad on the chip and said first end of said RF interconnect transmission line.

7. The interconnect package of claim 5 wherein said RF coupling means includes means for electromagnetically coupling said RF interconnect transmission line and the RF contact pad on the chip.

8. The interconnect package of claim 7 wherein said RF interconnect transmission line is disposed on the surface of said interconnect member facing the first surface of the chip.

9. The interconnect package of claim 7 wherein said RF interconnect transmission line is disposed on the surface of said interconnect member facing away from the first surface of the chip.

10. The interconnect package of claim 7 wherein said RF coupling means further includes:
    hard stops for providing substantially uniform spacing between said interconnect member and said support member.

11. The interconnect package of claim 1 and further including:
    an input/output substrate disposed on the surface of said support member facing said interconnect member;

an input/output interconnect disposed on said input-/output substrate; and
means for coupling said interconnect transmission line to said input/output interconnect.

12. The interconnect package of claim 5 wherein said support member includes a recess formed therein for retaining the chip.

13. The interconnect package of claim 1 and further comprising:
a lid disposed such that said interconnect member is positioned between said lid and said support member; and
a seal ring surrounding said interconnect member and disposed between said lid and said support member.

14. The interconnect package of claim 1 wherein said interconnect member has a first surface facing said support member and a second surface facing away from said support member, said interconnect package further comprising:
means for providing circuit components on at least one of said first surface of said interconnect member, said second surface of said interconnect member and the surface of said support member facing said interconnect member.

15. An interconnect package for a monolithic microwave integrated circuit chip, comprising:
a carrier having a recess in a first surface thereof to retain the chip;
a package ground means disposed on a second surface of said carrier, whereby a chip ground plane on a first surface of the chip is in substantial planar contact with said package ground means;
an interconnect substrate positioned proximate to and substantially parallel to said first surface of said carrier, said interconnect substrate having:
an RF interconnect transmission line disposed on a surface of said interconnect substrate; and
a DC interconnect transmission line disposed on a surface of said interconnect substrate;
a dielectric layer disposed between said interconnect transmission lines and said package ground means;
means for coupling an RF contact pad on the chip to said RF interconnect transmission line; and
means for coupling a DC contact pad to the chip to said DC interconnect transmission line;
whereby said RF interconnect transmission line, said package ground means and said dielectric layer form a waveguide for transmission of RF signals to and from the RF contact pad of the chip.

16. The interconnect package of claim 15 and further comprising:
an RF input/output interconnect on said first surface of said carrier;
a DC input/output interconnect on said first surface of said carrier;
means for coupling said RF input/output interconnect to said RF interconnect transmission line; and
means for coupling said DC input/output interconnect to said DC interconnect transmission line.

17. The interconnect package of claim 15 wherein said RF coupling means includes:
means for electromagnetically coupling said RF interconnect transmission line to the RF contact pad on the chip.

18. The interconnect package of claim 17 wherein said RF coupling means includes:

means for directly coupling said RF interconnect transmission line to the RF contact pad on the chip.

19. The interconnect package of claim 18 wherein said direct RF coupling means comprises:
a solder bump disposed between the RF contact pad on the chip and said RF interconnect transmission line.

20. The interconnect package of claim 15 wherein said RF interconnect transmission line on said interconnect substrate faces said first surface of said carrier.

21. The interconnect package of claim 15 wherein said RF interconnect transmission line on said interconnect substrate faces away from said first surface of said carrier.

22. The interconnect package of claim 15 wherein said dielectric layer includes:
an air gap having a substantially uniform thickness.

23. The interconnect package of claim 15 wherein said dielectric layer includes:
said dielectric interconnect substrate.

24. The interconnect package of claim 15 wherein said RF and DC interconnect transmission lines comprise:
thin-film microstrip patterned onto said dielectric interconnect substrate.

25. The interconnect package of claim 15 wherein said DC coupling means includes:
a solder bump disposed between the DC contact pad on the chip and said DC interconnect transmission line.

26. The interconnect package of claim 15 wherein:
said RF interconnect transmission line is disposed on a first surface of said interconnect substrate; and
said DC interconnect transmission line is disposed on a second surface of said interconnect substrate, said second surface being different from said first surface.

27. The interconnect package of claim 15 wherein:
said RF interconnect transmission line is disposed on the same surface of said interconnect substrate as said DC interconnect transmission line.

28. The interconnect package of claim 15 wherein said interconnect substrate has a surface facing away from said carrier and wherein said DC coupling means includes:
said DC interconnect transmission line being disposed on said surface of said interconnect substrate facing away from said carrier;
a metallized via formed through said interconnect substrate in electrical contact with said DC interconnect transmission line; and
a solder bump for providing electrical contact between said metallized via and the DC contact pad on the chip.

29. The interconnect package of claim 15 and further including:
a lid disposed such that the chip and said interconnect substrate are positioned between said lid and said carrier; and
a seal ring surrounding said interconnect substrate and disposed between said lid and said carrier.

30. An interconnect package for an integrated circuit chip having an internal waveguide for transmission of RF signals within the chip and connected to at least one chip contact pad on a first surface, comprising:
a carrier having a recess formed in a first surface thereof for retaining the chip;

means for waveguide transmission of RF signals to and from the chip, including:
  an interconnect substrate disposed proximate and substantially parallel to said carrier;
  an interconnect transmission line disposed on a surface of said substrate and having first and second ends;
  a conductive surface supported by said carrier in opposing relation to said interconnect transmission line; and
  dielectric means disposed between said interconnect transmission line and said conductive surface; and
means for coupling the at least one chip contact pad on a chip to be retained in the recess to said first end of said interconnect transmission line for substantially continuous waveguide transmission of RF signals to and from the chip to be retained in the recess.

31. The interconnect package of claim 30 wherein said interconnect transmission line faces the first surface of the chip and said means for coupling includes a solder bump disposed between the chip contact pad and said first end of said interconnect transmission line.

32. The interconnect package of claim 30 wherein said interconnect transmission line faces away from said first surface of the chip and said means for coupling includes:
  a metallized via formed through said interconnect substrate and in electrical contract with said first end of said interconnect transmission line; and
  a solder bump disposed between the chip contact pad and said via.

33. The interconnect package of claim 30 and further including:
  an input/output substrate disposed on said first surface of said carrier substrate;
  an input/output interconnect disposed on said input/output substrate; and
  means for coupling said second end of said interconnect transmission line to said input/output interconnect.

34. An interconnect package for an integrated circuit chip having at least one chip contact pad on a first surface, comprising:
  a carrier having a recess formed in a first surface thereof for retaining the chip;
  an interconnect substrate disposed proximate and substantially parallel to said carrier;
  an interconnect transmission line disposed on a surface of said substrate and having first and second ends;
  means for coupling the chip contact pad to said first end of said interconnect transmission line, wherein said interconnect transmission line is operable for transmission of electrical currents to and from the chip; and
  means for transmission of RF signals to and from the chip, comprising:
    a package ground means disposed on a second surface of said carrier wherein a chip ground plane on a second surface of the chip is in substantial planar contact with said package ground means;
    an RF interconnect transmission line disposed on a surface of said interconnect substrate, said RF interconnect transmission line having a first end;
    a dielectric layer disposed between said RF interconnect transmission line and said package ground means; and
    RF coupling means for coupling the contact pad with a first end of said RF interconnect transmission line;
    wherein said RF interconnect transmission line, said package ground means and said dielectric layer form a waveguide for transmission of RF signals.

35. The interconnect package of claim 34 wherein said RF coupling means includes:
  said RF interconnect transmission line being disposed on the surface of said interconnect substrate facing the first surface of the chip; and
  a solder bump disposed between the contact pad on the chip and said first end of said RF interconnect transmission line.

36. The interconnect package of claim 34 wherein said RF coupling means includes means for electromagnetically coupling said RF interconnect transmission line and the contact pad on the chip.

37. The interconnect package of claim 36 wherein said RF interconnect transmission line is disposed on the surface of said interconnect substrate facing the first surface of the chip.

38. The interconnect package of claim 36 wherein said RF interconnect transmission line is disposed on the surface of the interconnect substrate facing away from the first surface of the chip.

39. The interconnect package of claim 34 wherein said RF coupling means further includes:
  means for providing substantially uniform spacing between said interconnect substrate and said carrier.

40. The interconnect package of claim 30 and further comprising:
  a lid disposed on the interconnect package such that said interconnect substrate is positioned between said lid and said carrier; and
  a seal ring surrounding said interconnect substrate and disposed between said lid and said carrier.

41. The interconnect package of claim 40 wherein said base, said I/O substrate, said interconnect substrate, said lid and said seal ring are formed from materials having coefficients of thermal expansion which are closely matched with the coefficient of thermal expansion of the chip.

42. The interconnect package of claim 30 wherein said interconnect substrate has a first surface facing said carrier and a second surface facing away from said carrier, said interconnect package further comprising means for providing peripheral circuit components on at least one of: said first surface of said interconnect substrate, said second surface of said interconnect substrate and the surface of said carrier facing said interconnect substrate.

43. The interconnect package of claim 2 wherein said interconnect transmission line is disposed on the surface of said interconnect member facing the first surface of the chip.

44. The interconnect package of claim 2 wherein said interconnect transmission line is disposed on the surface of said interconnect member facing away from the first surface of the chip.

45. The interconnect package of claim 2 wherein said means for waveguide transmission further includes:
  hard stops for providing substantially uniform spacing between said interconnect member and said support member.

46. The interconnect package of claim 1 wherein said means for waveguide transmission further includes:
  said chip ground plane being in substantial planar contact with said package ground means.

* * * * *